United States Patent
Yoshino et al.

(10) Patent No.: US 7,911,042 B2
(45) Date of Patent: Mar. 22, 2011

(54) PACKAGE HAVING SHIELD CASE

(75) Inventors: Yuya Yoshino, Nagano (JP); Akinobu Inoue, Nagano (JP); Atsunori Kajiki, Nagano (JP); Sadakazu Akaike, Nagano (JP); Norio Yamanishi, Nagano (JP); Takashi Tsubota, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/000,105

(22) Filed: Dec. 7, 2007

(65) Prior Publication Data
US 2008/0157296 A1 Jul. 3, 2008

(30) Foreign Application Priority Data
Dec. 13, 2006 (JP) .............................. P2006-335958

(51) Int. Cl.
*H01L 23/02* (2006.01)
(52) U.S. Cl. ... 257/678; 257/659; 257/98; 257/E23.191; 257/E23.193
(58) Field of Classification Search .................. 257/678, 257/659, 98, E23.191, E23.193
See application file for complete search history.

(56) References Cited

U.S. PATENT DOCUMENTS

| | | | | |
|---|---|---|---|---|
| 6,687,135 | B1 * | 2/2004 | Kitade | 361/816 |
| 2004/0159926 | A1 * | 8/2004 | Moriwaki | 257/678 |
| 2006/0177083 | A1 * | 8/2006 | Sjursen et al. | 381/322 |
| 2006/0202041 | A1 * | 9/2006 | Hishizawa et al. | 235/492 |

FOREIGN PATENT DOCUMENTS
JP 10-284935 10/1998
* cited by examiner

*Primary Examiner* — Cuong Q Nguyen
*Assistant Examiner* — Cathy N Lam
(74) *Attorney, Agent, or Firm* — Drinker Biddle & Reath LLP

(57) ABSTRACT

A package includes: a package body including a substrate, an electronic component mounted on a first surface of the substrate, and a sealing resin layer for sealing the electronic component; and a shield case for covering the sealing resin layer, the shield case being made of metal and having an inverted U-shape in a cross-sectional view, wherein a bent part of the shield case is formed in such a manner that at least a part of an end of the shield case is bent toward a second surface of the substrate opposite to the first surface, and the bent part abuts on the second surface so that the shield case is attached to the substrate.

7 Claims, 4 Drawing Sheets

PACKAGE HAVING SHIELD CASE

This application is based on and claims priority from Japanese Patent Application No. 2006-335958, filed on Dec. 13, 2006, the entire contents of which are hereby incorporated by reference.

BACKGROUND OF THE INVENTION

1. Technical Field

The present disclosure relates to a package having a shield case, and more particularly to a package in which one surface of a substrate on which an electronic component is mounted is covered by a metallic shield case.

2. Background Art

In a package having a shield case, one surface of a substrate on which an electronic component is mounted is covered by a metallic shield case, and the package as shown in FIG. 4 is proposed in, for example, Japanese Unexamined Patent Publication: No. 10-284935.

In the package as shown in FIG. 4, each of the pawl parts 104, 104, . . . is formed in a lower end side of a metallic shield case 102 for covering one surface of a substrate 100 and is fitted into a corresponding recess 106 of recesses 106, 106, . . . formed in side surfaces of the substrate 100.

In the package as shown in FIG. 4, the pawl part 104 of the shield case 102 for covering electronic components 108, 108, . . . such as semiconductor elements mounted on the one surface of the substrate 100 are fitted into the recess 106 formed in the side surface of the substrate 100 and also is soldered on a plated layer 110 formed on a wall surface of the recess 106 by solder 112 as shown in a cross-sectional view of FIG. 5.

In addition, solder balls 114, 114, . . . serving as a plurality of external connection terminals are formed on another surface of the substrate 100.

The package shown in FIGS. 4 and 5 can be preferably used in a package in which a high-frequency component as an electronic component is mounted on one surface of a substrate.

However, in the conventional package having the shield case, as shown in FIG. 6, it is necessary to use the substrate 100 in which the recesses 106, 106, . . . are formed in the side surfaces. Thus, it is difficult to seal the electronic components 108, 108, . . . mounted on the one surface of the substrate 100 using a resin.

Namely, in the case of industrially manufacturing the substrate 100 shown in FIG. 6, as shown in FIG. 7, after forming a large-size original substrate 200 in which a plurality of substrates 100, 100, . . . are formed, elliptic through holes 202, 202, . . . are formed in parts of large-size original substrate 200 where the recesses 106, 106, . . . are formed, and then the plated layer 110 is formed on inner wall surfaces of the elliptic through holes 202, 202, . . . using electroless plating etc.

Next, after various electronic components are mounted on a region surrounded by the elliptic through holes 202, 202, . . . , the original substrate 200 is cut according to lines 204, 204, . . . passing through the centers of the elliptic through holes 202, 202, . . . and thus the substrate 100 shown in FIG. 6 can be obtained.

Thereafter, the shield case 102 is attached to the substrate 100 and the corresponding pawl parts 104 formed in the lower end side of the shield case 102 are fitted into each of the recesses 106, 106, . . . formed in the side surfaces of the substrate 100 and then the pawl parts 104 are soldered.

In this case, when the electronic components 108, 108, . . . are sealed with a resin after the electronic components 108, 108, . . . are mounted on the one surface of the substrate 100 in which the elliptic through holes 202, 202, . . . are formed, there is a possibility that the sealing resin penetrates into the elliptic through holes 202 and thus the pawl parts 104 of the shield case 102 cannot be fitted.

Therefore, the electronic components 108, 108, . . . mounted on the one surface of the substrate 100 are not sealed with the resin. In this case, in order to prevent contact between the metallic shield case 102 and the electronic components 108, 108, . . . , it is necessary to always ensure a space between the shield case 102 and the electronic components 108, 108, . . . and thus there is a limit to a request for downsizing of the package.

Further, a bonding wire that can cause contact with the shield case 102 cannot be used in electrical connection between the electronic components 108 and the substrate 100, and only a flip chip bonding can be used. Thus, it is requested that a bonding wire be used in electrical connection between the electronic components 108 and the substrate 100 even for the package having the shield case.

SUMMARY OF THE INVENTION

The present invention solves the problem that an electronic component mounted on one surface of a substrate cannot be sealed with a resin in the conventional package, and an object of the present invention is to provide a package having a shield case that can make an electrical connection between an electronic component and a substrate using a bonding wire and achieve downsizing by sealing the electronic component mounted on the one surface of the substrate with a resin.

According to one or more aspects of the present invention, a package comprises:
  a package body including:
    a substrate;
    an electronic component mounted on a first surface of the substrate;
    a sealing resin layer for sealing the electronic component; and
    a shield case for covering the sealing resin layer, the shield case being made of metal and having an inverted U-shape in a cross-sectional view,
  wherein a bent part of the shield case is formed in such a manner that at least a part of an end of the shield case is bent toward a second surface of the substrate opposite to the first surface, and
  the bent part abuts on the second surface so that the shield case is attached to the substrate.

According to a second aspect of the present invention, the bent part may have an elastic force toward the second surface when the bent part abuts on the second surface.

According to a third aspect of the present invention, a connection pad made of metal may be formed on a part of the second surface where the bent part abuts.

According to a fourth aspect of the present invention, the package body may further include a bonding pad electrically connected to the electronic component by a bonding wire and the bonding wire may be sealed with the sealing resin layer.

According to a fifth aspect of the present invention, the electronic component may be a semiconductor element.

According to a sixth aspect of the present invention, the shield case may be attached to the substrate so that an inner surface of the shield case is in close contact with a surface of the sealing resin layer.

According to the second aspect of the present invention, the shield case can surely be attached to the substrate.

According to the third aspect of the present invention, the shield case can tightly be attached to the substrate by soldering the bent part of the shield case and the connection pad of the substrate.

According to the fourth aspect of the present invention, contact between the bonding wire and the shield case can surely be prevented.

According to the sixth aspect of the present invention, the package can be miniaturized.

In the package according to the present invention, it is unnecessary to provide an attachment part for attaching the shield case to a side surface of the substrate, so that the sealing resin layer for sealing the electronic component mounted on one surface (the first surface) of the substrate can be formed.

Also, contact between the shield case and the electronic component can surely be prevented and it is unnecessary to provide a space between the electronic component and the shield case and thus the package can be miniaturized.

Also, even when the electronic component mounted on the one surface (first surface) of the substrate is electrically connected to the substrate by a bonding wire, a sealing resin layer for sealing the electronic component and the bonding wire can be formed and contact between the bonding wire and the shield case can surely be prevented.

DETAILED DESCRIPTION OF EXEMPLARY EMBODIMENTS

Figure 1:
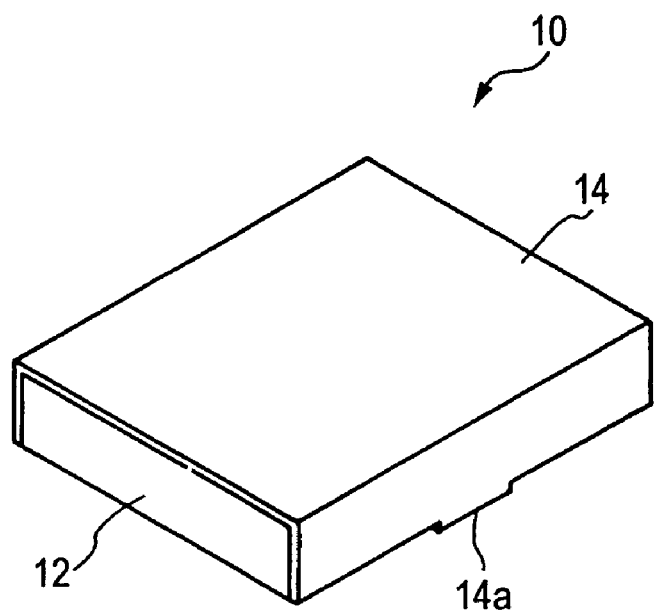
FIG. 1 is a perspective view showing one example of a package having a shield case according to the present invention.

FIG. 1 shows one example of a package having a shield case according to the present invention. In a package 10 having a shield case shown in FIG. 1, a metallic shield case 14 is attached so as to cover a package body 12. The shield case 14 is made of an alloy (such as nickel silver) of copper, nickel and zinc, and the thickness is about 50 μm.

Figure 2:
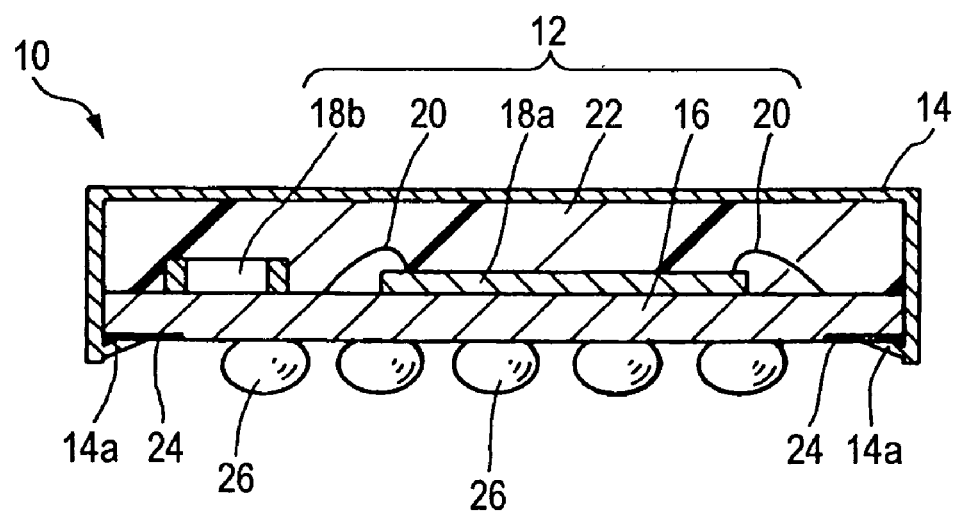
FIG. 2 is a cross-sectional view of the package shown in FIG. 1.

FIG. 2 shows a cross-sectional view of the package 10. In the package body 12, electronic components such as a semiconductor element 18a or a capacitor 18b are mounted on one surface (hereafter referred as to "first surface") of a substrate 16 and a bonding pad part (not shown) formed on the first surface of the substrate 16 is electrically connected to an electrode (not shown) of the semiconductor element 18a by bonding wires 20, 20 of gold. The electronic components and bonding wires 20, 20 are sealed by a sealing resin for forming a sealing resin layer 22.

In the shield case 14 by which the sealing resin layer 22 is covered, the cross-sectional shape is an inverted U-shape and parts of the lower ends are bent to the other surface (hereafter referred as to "second surface") of the substrate 16 at respective bend points on the sides of the shield case and thus bent parts 14a are formed. The bent parts 14a each extend back toward the second surface, and each have an end that is closer to the second surface than the bend point when viewed in a direction toward the second surface, so that the respective end of each bent part abuts on a respective one of connection pads 24, 24 formed on the second surface of the substrate 16 and are attached to the substrate 16.

Furthermore, as can be appreciated from FIG. 2, bent parts 14a of the shield case 14 are bent in a "V"-shape with an acute angle present between each bent part 14a and its respective side of the shield case 14, and when the bent parts 14a abut on the connection pads 24, 24 of the substrate 16, the bent parts 14a has an elastic force toward the connection pads 24, 24 and thus the shield case 14 can surely be attached to the substrate 16.

By soldering positions of abutment of the bent parts 14a on the connection pads 24, 24, the shield case 14 can be attached to the substrate 16 more tightly.

In addition, solder balls 26, 26, . . . serving as external connection terminals of the package 10 are attached to the second surface of the substrate 16.

In the package 10 shown in FIGS. 1 and 2, the shield case 14 is attached to the substrate 16 in such a manner that an inner surface of the shield case 14 is in close contact with a surface of the sealing resin layer 22. The electronic components such as the semiconductor element 18a and the bonding wires 20 for electrically connecting the semiconductor element 18a to the substrate 16 are sealed with a resin by the sealing resin layer 22 and even when the shield case 14 is attached to the substrate 16 in such a manner that the inner surface of the shield case 14 is in close contact with the surface of the sealing resin layer 22, there is no possibility that the shield case 14 makes contact with the electronic components or the bonding wires. Therefore, it is unnecessary to provide a space between the electronic components and the shield case 14, and the package can be downsized.

In manufacturing the package 10 shown in FIGS. 1 and 2, the package body 12 is first formed.

Figure 7:
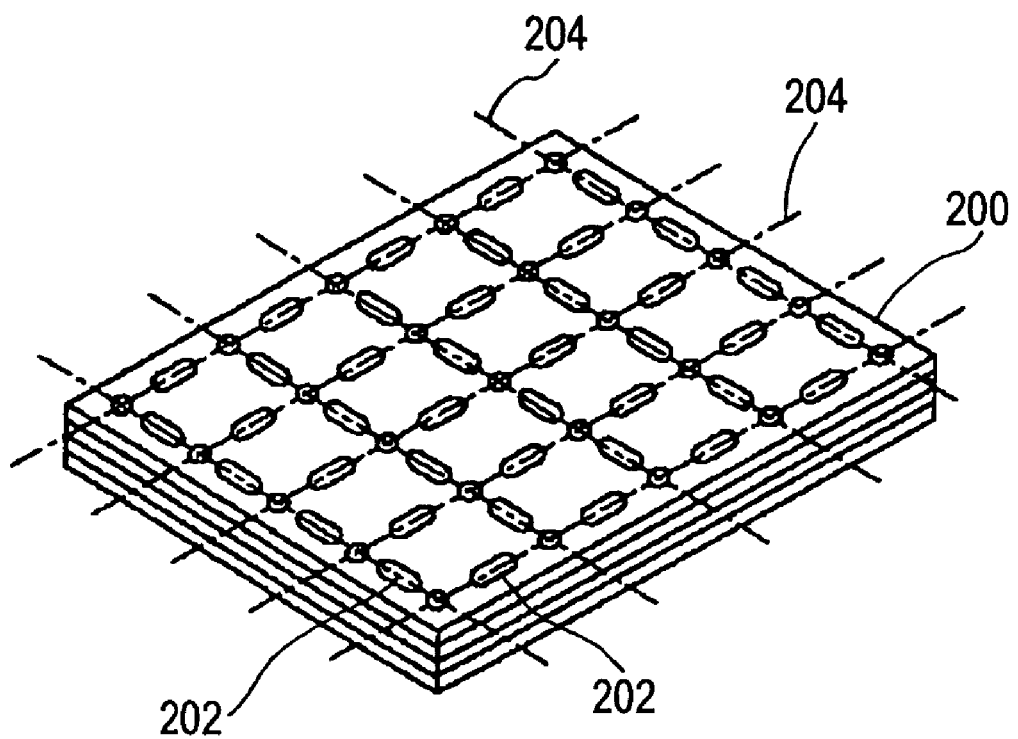
FIG. 7 is a perspective view of an original substrate, where the substrate shown in FIG. 6 is formed.

In the package body 12, a large-size original substrate capable of forming a plurality of substrates 16 is formed. A through hole such as the elliptic through holes 202, 202, . . . shown in FIG. 7 is not formed in this original substrate.

After electronic components such as the semiconductor element 18a or the capacitor 18b are mounted on predetermined positions of first surface of the portion corresponding to each substrate 16 on the first surface of the original substrate, the mounted semiconductor element 18a is electrically connected to the portion corresponding to the substrate 16 by the bonding wires 20.

Then, the portion corresponding to each substrate 16 is molded by resin and the sealing resin layer 22 for sealing the bonding wires 20 and the electronic components mounted on the portion corresponding to each substrate 16 is provided. Thereafter, by cutting the original substrate, the package body 12 having a predetermined shape can be formed.

Further, it is preferable to simultaneously form the connection pads 24, 24 formed on the back side of the substrate 16 when terminal connection pads (not shown) for attaching solder balls serving as external connection terminals are formed on the back side of the substrate 16.

The obtained package body 12 is inserted into the shield case 14 previously formed by press working etc. and then is attached, and each of the bent parts 14a of the package body 12 is matched with each of the connection pads 24 of the substrate 16.

Further, when the package body 12 is fixed to the substrate 16 more tightly, it is preferable to solder abutment parts of each of the bent parts 14a of the package body 12 on each of the connection pads 24 of the substrate 16.

In the shield case 14 shown in FIGS. 1 and 2, one bent part 14a is formed in one side of the lower end of the shield case 14, but a plurality of bent parts 14a may be formed. In the shield case 14 where the plurality of bent parts 14a are formed in one side of the lower end, the shield case 14 can surely be attached to the substrate 16.

Figure 3:
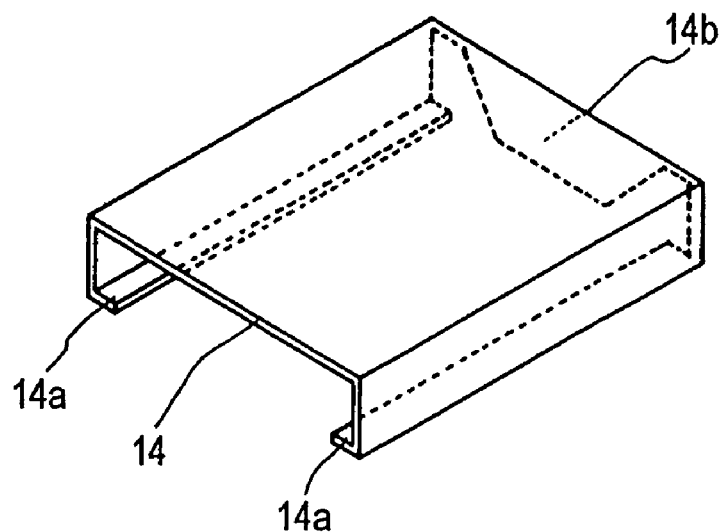
FIG. 3 is a perspective view showing another example of a shield case capable of being used in the present invention.
Figure 4:
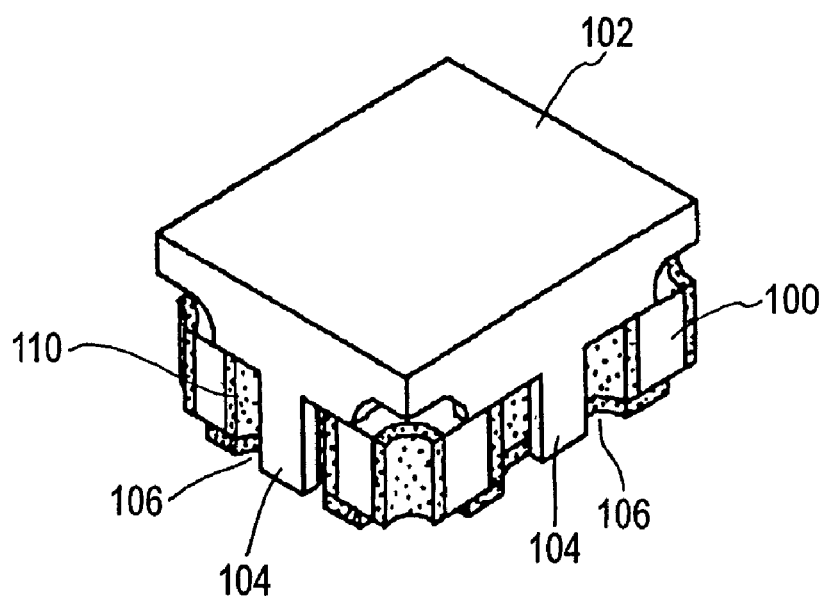
FIG. 4 is a perspective view showing a conventional package having a shield case.
Figure 5:
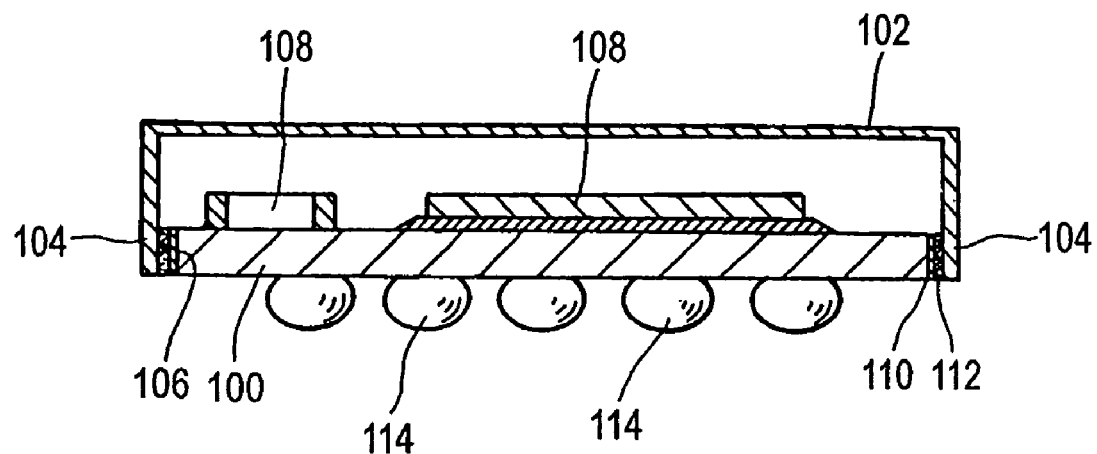
FIG. 5 is a transverse sectional view of the package shown in FIG. 4.
Figure 6:
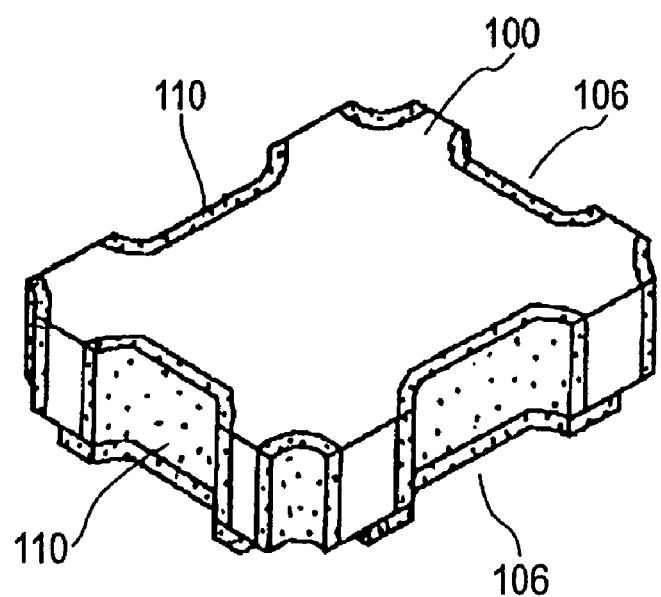
FIG. 6 is a perspective view of a substrate used in the package shown in FIG. 5.

Further, like the shield case 14 shown in FIG. 3, the bent parts 14a may be formed along the edge of one side of the lower end of the shield case 14. In this case, it is preferable to form a stopper 14b in the other side of the shield case 14 in order to prevent excessive insertion of the package body 12 when the package body 12 is inserted from one side of the shield case 14 and is attached.

In the description of FIGS. 1 to 3, while the mounted semiconductor element 18a is electrically connected to the substrate 16 by the bonding wires 20, it will be obvious that the semiconductor element 18a may be electrically connected to the substrate 16 by a flip chip bonding.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. A package comprising:
   a package body including:
      a substrate;
      an electronic component mounted on a first surface of the substrate;
      a sealing resin layer for sealing the electronic component; and
   a shield case including:
      a portion for substantially covering a surface of the sealing resin layer,
      two side portions extending generally transverse to the portion, each of the two side portions substantially covering a respective side of the package body formed by the sealing resin layer and the substrate, and
      an opening defined by the portion and the two side portions, the opening having a predetermined size for inserting another side of the package body formed by the sealing resin layer and the substrate, and a stopper extending from the portion between the two side portions opposite the opening to prevent excessive insertion of the package body when the package body is inserted through the opening
   the shield case being made of metal and having an inverted U-shape in a cross-sectional view,
   wherein a lower end of the side portion is bent at a bend point to form a bent part that extends back toward a second surface of the substrate opposite to the first surface, so that a portion of the side near the bend point and the bent part of the shield case form a "V"-shape, with an end of the bent part being closer to the second surface than the bend point when viewed in a direction toward the second surface, so that the end of the bent part abuts on and contacts an area on the second surface to attach the shield case to the substrate, and
   wherein the bent part has an elastic force toward the second surface when the end of the bent part abuts on and contacts the area on the second surface.

2. The package of claim 1, wherein
a connection pad made of metal is formed on the area of the second surface where the end of the bent part abuts so that the bent part contacts the connection pad.

3. The package of claim 1, wherein
the package body further includes a bonding pad electrically connected to the electronic component by a bonding wire and
the bonding wire is sealed with the sealing resin layer.

4. The package of claim 3, wherein
the electronic component is a semiconductor element.

5. The package of claim 1, wherein
the shield case is attached to the substrate so that an inner surface of the shield case is in close contact with the surface of the sealing resin layer.

6. The package of claim 1, wherein
the substrate further comprises a first side surface extending between the first surface and the second surface, and forming an edge where the first side surface meets the second surface; and
the bent part extends over the edge and the end of the bent part contacts the area of the second surface.

7. The package of claim 1, wherein
an acute angle is present between a portion of the side near the bend point and the bent part.

* * * * *